US006812880B2

(12) United States Patent
Paulus

(10) Patent No.: US 6,812,880 B2
(45) Date of Patent: Nov. 2, 2004

(54) ANALOG-TO-DIGITAL CONVERTER AND METHOD FOR CONVERTING AN ANALOG SIGNAL INTO A DIGITAL SIGNAL

(75) Inventor: Christian Paulus, Weilheim (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/433,711

(22) PCT Filed: Dec. 4, 2001

(86) PCT No.: PCT/DE01/04539

§ 371 (c)(1),
(2), (4) Date: Sep. 29, 2003

(87) PCT Pub. No.: WO02/47273

PCT Pub. Date: Jun. 13, 2002

(65) Prior Publication Data

US 2004/0061636 A1 Apr. 1, 2004

(30) Foreign Application Priority Data

Dec. 4, 2000 (DE) .......................... 100 60 159

(51) Int. Cl.⁷ ................................ H03M 1/34
(52) U.S. Cl. .................. 341/164; 341/155; 341/159
(58) Field of Search ................... 341/164, 155, 341/159, 160

(56) References Cited

U.S. PATENT DOCUMENTS

| 4,395,732 A | 7/1983 | Upton |
| 4,978,957 A | 12/1990 | Hotta et al. |
| 5,291,198 A | 3/1994 | Dingwall et al. |
| 5,420,587 A | 5/1995 | Michel |
| 5,617,092 A | * 4/1997 | Pace ........................... 341/155 |
| 5,736,952 A | * 4/1998 | Kertis et al. ................. 341/159 |
| 5,815,106 A | * 9/1998 | Poss et al. ................... 341/159 |
| 6,072,416 A | 6/2000 | Shima |
| 6,570,522 B1 | * 5/2003 | Galambos et al. .......... 341/155 |

FOREIGN PATENT DOCUMENTS

EP    0 328 215    8/1989

OTHER PUBLICATIONS

Krenik, W., et al., Current–Mode Flash A/D Conversion Based on Current–Splitting Techniques, Proceedings of the International Symposium on Circuits and Systems, San Diego, CA, May 10–13, 1992, IEEE, U.S. bd. 4 Conf. 25, pp. 585–588, ISBN: 0–7803–0593–0 (1992).

* cited by examiner

*Primary Examiner*—Michael Tokar
*Assistant Examiner*—Lam T. Mai
(74) *Attorney, Agent, or Firm*—Altera Law Group, LLC; Jeffrey R. Stone

(57) ABSTRACT

The invention relates to an analog-to-digital converter (301), comprising several comparators (303) and a reference network, said reference network having several reference elements (302). At least one input (304) of at least one comparator (303) is connected between the individual reference elements (302) of the reference network in the analog-to-digital converter (301), respectively. A digital evaluation circuit (311) with which the statistical evaluation of the output signals generated by the comparators (303) can be carried out is linked to the outputs (309) of the comparators of the analog-to-digital converter (301). The invention also relates to a corresponding method for converting an analog signal ($U_a$) into a digital signal (D).

9 Claims, 5 Drawing Sheets

PRIOR ART

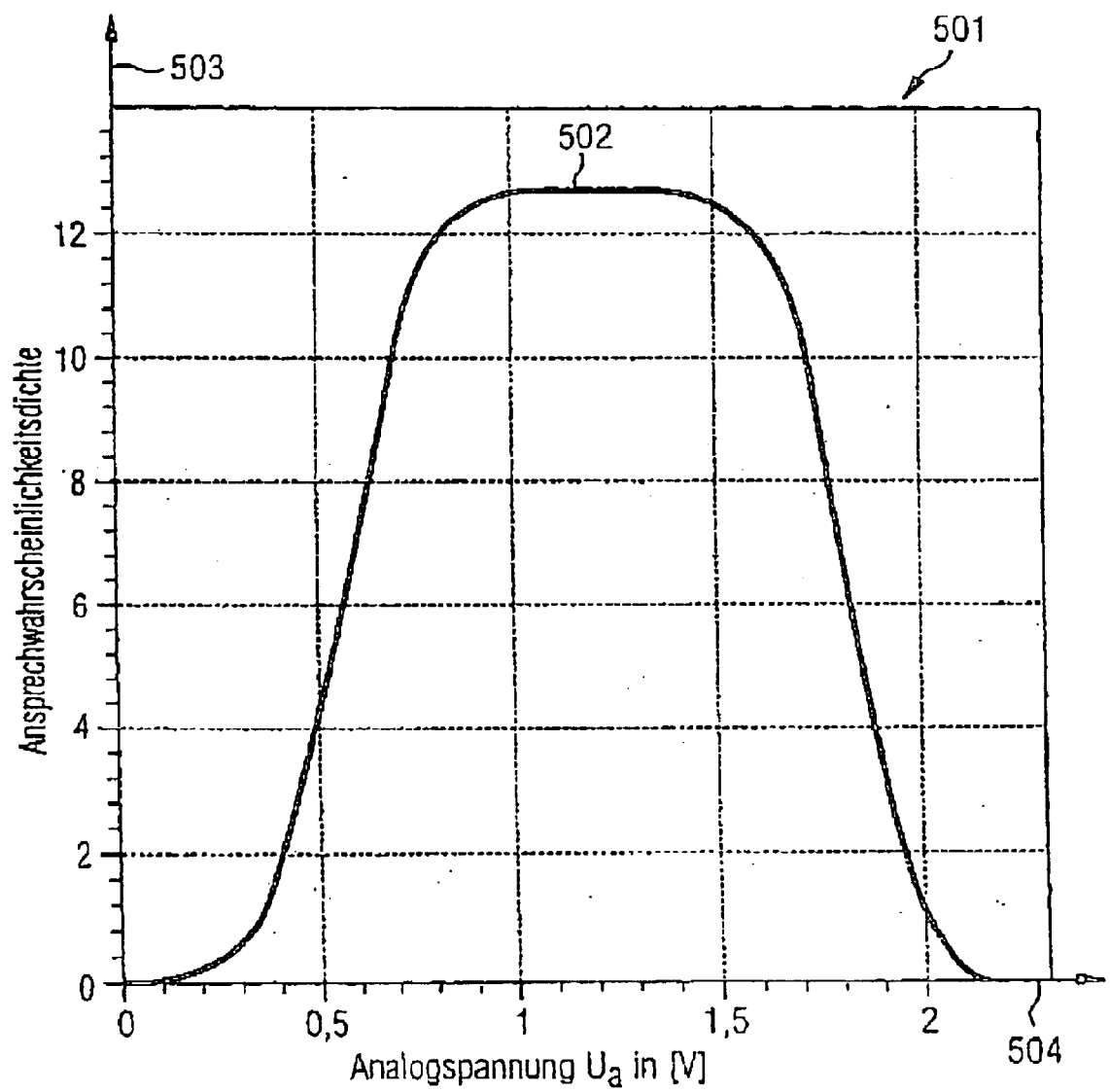

ANALOG-TO-DIGITAL CONVERTER AND METHOD FOR CONVERTING AN ANALOG SIGNAL INTO A DIGITAL SIGNAL

BACKGROUND OF THE INVENTION

1. Field of the Invention

The invention relates to an analog/digital converter and to a method for converting an analog signal into a digital signal.

Analog/digital converters (ADCs) are produced on the basis of the prior art as an integrated circuit utilizing metal oxide semiconductor structures and/or bipolar semiconductor structures on semiconductor substrates as standard. With high demands on the signal processing speed, so called "flash ADCs" are frequently reverted to.

2. Description of the Related Prior Art

As FIG. 1 shows, a flash ADC based on the prior art is an analog/digital converter 101 which has, by way of example, a resistor cascade containing a plurality of series-connected resistors 102 and a plurality of comparators 103, with a first input 104 on the comparators 103 being connected between two respective adjacent resistors 102, as a reference network. A reference voltage $U_{ref}$ is applied to the resistor cascade between the cascade input 105 and the ground connection 106 such that the reference voltage $U_{ref}$ drops in partial voltages between the resistors 102. These partial voltages are evaluated by a respective one of the comparators 103. To make illustration clearer, FIG. 1 shows just three comparators 103, but the flash ADC can have any number of comparators 103.

An analog signal to be converted, i.e. an analog voltage $U_a$, is applied via an analog signal input 107 to a second input 108 on all the comparators 103 in parallel. The comparators 103 then compare the analog voltage $U_a$ applied to the second input 108 with the respective partial voltage applied to the first input 104. If the analog voltage $U_a$ applied to one of the comparators 103 is higher than the partial voltage applied, then the comparator 103 has been activated and outputs at an output 109 a bit signal which corresponds to a first bit value "1", otherwise the bit signal corresponds to a second bit value "0".

Finally, a digital evaluation unit 110 produces a digital output signal D in line with the comparator 103 activated with the highest partial voltage, and outputs this signal at a digital signal output 111.

FIG. 1 shows, in each of the comparators 103, a graph 112 plotting a probability density dW against a voltage difference ΔU. In this case, dW denotes the probability density of there being a change from a first bit value "1" to a second bit value "0" or vice versa for the indicated input difference voltage ΔU at the output 109 of the respective comparator 103. An ideal comparator has an infinitesimally narrow probability density dW, i.e. the change from one bit value to the other bit value takes place exactly at the input difference voltage ΔU=0. On account of statistical effects, real comparators have a broad probability density dW, however. By way of example, the result of this is that the comparator 103 would (not) be activated even though an analog voltage $U_a$ which is (higher) lower than the applied partial voltage is applied. The voltage difference ΔU plotted in the graph 112 is formed from the applied partial voltage of the reference voltage $U_{ref}$ and the applied analog voltage $U_a$.

FIG. 2 shows a graph 201 plotting a curve 202 for the response probability density 203 of comparators 103 in the flash ADC described in FIG. 1 against the applied analog voltage $U_a$ 204. The graph 201 results from a combination of the individual probability densities dW of the comparators 103, which are shown in FIG. 1 as individual graphs 112 in the comparators 103.

Since each comparator 103 is associated with a different portion of the reference voltage $U_{ref}$, the curve 202 for the response probability density 203 of the comparators 103 is obtained from a linear plot of the individual probability densities dW of adjacent comparators 103 in a rising direction against the applied analog voltage $U_a$ 204. The result of the virtually isolated probability densities dW of the individual comparators 103 is that the changes in the comparators 103 are very precisely defined and the flash ADC thus has a high level of accuracy. On the basis of the prior art, flash ADCs are produced with accuracies of typically 5 to 6 bits and are used, inter alia, in the read paths of hard disks.

A commonly used analog/digital converter normally involves the use of resistors for producing the reference values, which are produced on the semiconductor substrate from a semiconductor material, each corresponding resistance value being determined by the number of atomic, molecular and crystallite boundaries in the semiconductor material within the respective resistance area A.

If the resistance area A is reduced, the atomic, molecular or crystallite number in the semiconductor crystal falls, and hence the number of atomic, molecular and crystallite boundaries falls, as a result of which the standard deviation of the resistance value corresponding to this resistance area A increases by the factor $(\sqrt{A})^{-1}$. If the resistance area A decreases, the probability W that a comparator has been activated and outputs an incorrect bit signal, even though an analog voltage $U_a$ is applied which is lower than the reference network's nominal partial voltage applied to the comparator in question, thus increases.

The accuracy of such an analog/digital converter is also determined by the statistical fluctuations in the transistor parameters. By way of example, the variation in the threshold voltage of an MOS transistor likewise decreases by a factor of $(\sqrt{A})^{-1}$ as the area of the transistor increases. This parameter variation in the comparator's transistors results in the "input offset voltage", so that a comparator does not turn round at an input voltage difference ΔU of exactly ΔU=0, but rather at an input voltage difference ΔU which corresponds to the individual comparator offset.

These statistical variations limit the linearity of the overall analog/digital converter system, which is why the design needs to take into account sufficient component areas in order to satisfy the demands on accuracy.

If the individual comparators have sufficient accuracy, then a chain of comparators connected to a resistor network in the manner described above has an output signal which is known as a thermometer code. This means that all the comparators whose first input is connected to a partial voltage of the reference voltage $U_{ref}$ which is lower than the analog voltage $U_a$ applied to the second input output the bit value "1", whereas all the other comparators output the bit value "0". Such output signals can then be converted particularly easily into a digital output word. Normally, a thermometer binary coder and the outputs of the comparators also have a correction logic unit connected between them, said correction logic unit eliminating so called "bubbles" in the thermometer code (a "0" between a plurality of "1"s and vice versa) in order to permit reliable binary coding.

The resistor network described above in connection with the flash ADCs is used for providing reference partial voltages with which an analog input voltage $U_a$ is compared in the comparators. Alternatively to the resistor networks, any other reference signal network can also be used. Thus, by way of example, it is also possible to use current sources having different output currents as a reference signal. The information-bearing variable used can thus be not just voltages, but rather "current-mode" solutions are also possible, which involve the information being represented by currents.

In contrast to the parameter variations, the parasitic capacitances which arise for relatively large component areas and are generally unwanted increase as the component area A increases. As a result, the signal processing speed decreases, however. This therefore means that a high level of accuracy in a commonly used analog/digital converter is to the detriment of the signal processing speed. On the basis of the prior art, flash converters in CMOS technology with conversion rates of up to 1 Gsa/s (giga samples per second= $10^9$ sampling operations per second) are produced with an accuracy of 6 bits.

In addition [1] describes an analog/digital converter with a reference network, a multiplicity of comparators and an interpolation unit. The interpolation unit comprises a multiplicity of additional comparators to which the output signals from the comparators in a first stage, which are connected directly to the reference network, are supplied following weighting of the output signals. The additional comparators thus serve as an interpolation unit for interpolating the signals provided by the comparators in the first stage.

The interpolation network described in [1] is used merely for recoding the information from the thermometer code into the binary code, with deterministic signal processing being performed continuously.

Another analog/digital converter having an interpolation network is described in [2].

BRIEF SUMMARY OF THE INVENTION

The invention is thus based on the problem of specifying an analog/digital converter and a method for converting an analog signal into a digital signal which allow a high level of accuracy and linearity to be achieved for the converter despite a small component size.

The problem is solved by an analog/digital converter and by a method for converting an analog signal into a digital signal having the features based on the independent patent claims.

An analog/digital converter has a plurality of comparators and a reference network, the reference network having a plurality of reference elements. Connected between each reference element in the analog/digital converter's reference network is at least one input of at least one comparator. The outputs of the comparators in the analog/digital converter have a digital evaluation circuit coupled to them which can be used for statistically processing output signals produced by the comparators.

A method for converting an analog signal into a digital signal involves a reference signal being applied to a reference network having a plurality of reference elements, and an analog signal being applied to at least one input of a plurality of comparators. With this method, the comparators, at least one further input of which is connected to the reference network, form a plurality of digital output signals which are subsequently processed statistically. The method according to the invention finally also involves a common digital signal being formed from the statistically processed output signals.

One advantage of the invention can clearly be seen in that the problem of the component mismatch is taken into account by virtue of a simple circuit being used to perform—erroneous—quantization very early in the analog signal path, and then statistical processing in the digital part of the analog/digital converter taking place. To this end, a large number of comparators having very small component areas and therefore poor accuracy are clearly used, and their digital outputs are counted using a suitable logic unit and are thereby averaged, for example.

Another advantage of the analog/digital converter according to the invention is its suitability for very low operating voltages. Since the proportion of the analog components in the analog/digital converter according to the invention is very small and the analog components also end up being very simple, the ratio of operating voltage to threshold voltage, from which point on a change can be detected in a comparator, for example, can be kept very low. This means that the analog/digital converter according to the invention is also suitable for use in novel integrated circuits having a low operating voltage.

Finally, another advantage which arises is that the digital part of the analog/digital converter according to the invention can be produced largely automatically by virtue of program/controlled activation of existing integrated circuits (VHDL=very high speed IC hardware description language). This significantly reduces the design complexity, and hence the manufacturing complexity, and also the manufacturing costs. In addition, simple portability to new technologies is ensured.

As reference network, the use of a resistor network, a current-source network or a capacitive network is preferred. Reference elements used are then resistors, current sources or capacitors.

Preferably, the digital evaluation circuit in the analog/digital converter according to the invention is set up such that the statistical processing of the output signals can involve formation of a statistical mean.

Alternatively, the statistical processing could also comprise filtering of the output signals in order to mask out digital outlier output signals, weighting of the output signals relative to the center of an output-signal cluster, or any other type of statistical signal processing. One advantage of statistical processing is the improvement in the accuracy of the analog/digital converter.

In one preferred embodiment of the analog/digital converter according to the invention, a plurality of comparators are connected in parallel between each reference element in the reference network, and the digital evaluation circuit is set up such that the statistical processing can involve the output signals produced by parallel comparators being averaged and a common output signal being formed therefrom.

In another preferred embodiment of the analog/digital converter according to the invention, a comparator having a plurality of outputs which are activated at different input difference voltages is connected between each reference element in the reference network. The digital evaluation circuit is set up such that the statistical processing can involve the output signals produced by the comparators being averaged and a common output signal being formed therefrom.

In another preferred embodiment of the analog/digital converter according to the invention, a plurality of comparators are grouped into a plurality of groups, and the digital evaluation circuit is set up such that the statistical processing can involve the output signals produced by the comparators in a respective group being averaged and a common output signal being formed therefrom.

In one preferred embodiment of the analog/digital converter according to the invention, fully differential signal processing is used. The analog input voltage $U_a$ and the reference voltage $U_{ref}$ are in the form of differential signals and are evaluated in comparators having at least two reference signal inputs and at least two measuring signal inputs.

The method according to the invention preferably involves the digital output signals being grouped into a plurality of signal groups containing a plurality of digital output signals. Accordingly, the statistical processing of the digital output signals is performed within the respective signal group.

Preferably, the method according to the invention involves the statistical processing performed being formation of a statistical mean for the digital output signals. This can be achieved, by way of example, by a 1-bit adder having n inputs when n outputs of comparators are available. With 255 adder inputs which can each take the bit value "0" or "1", this results in an output word having the length of 8 bits.

Exemplary embodiments of the invention are illustrated in the figures and are explained in more detail below. In this case, identical references denote identical components.

BRIEF DESCRIPTION OF THE DRAWINGS

In the figures,

FIG. 5 shows a graph of the relative response probability for comparators in an analog/digital converter based on an exemplary embodiment of the invention.

DETAILED DESCRIPTION OF THE INVENTION

Figure 3:
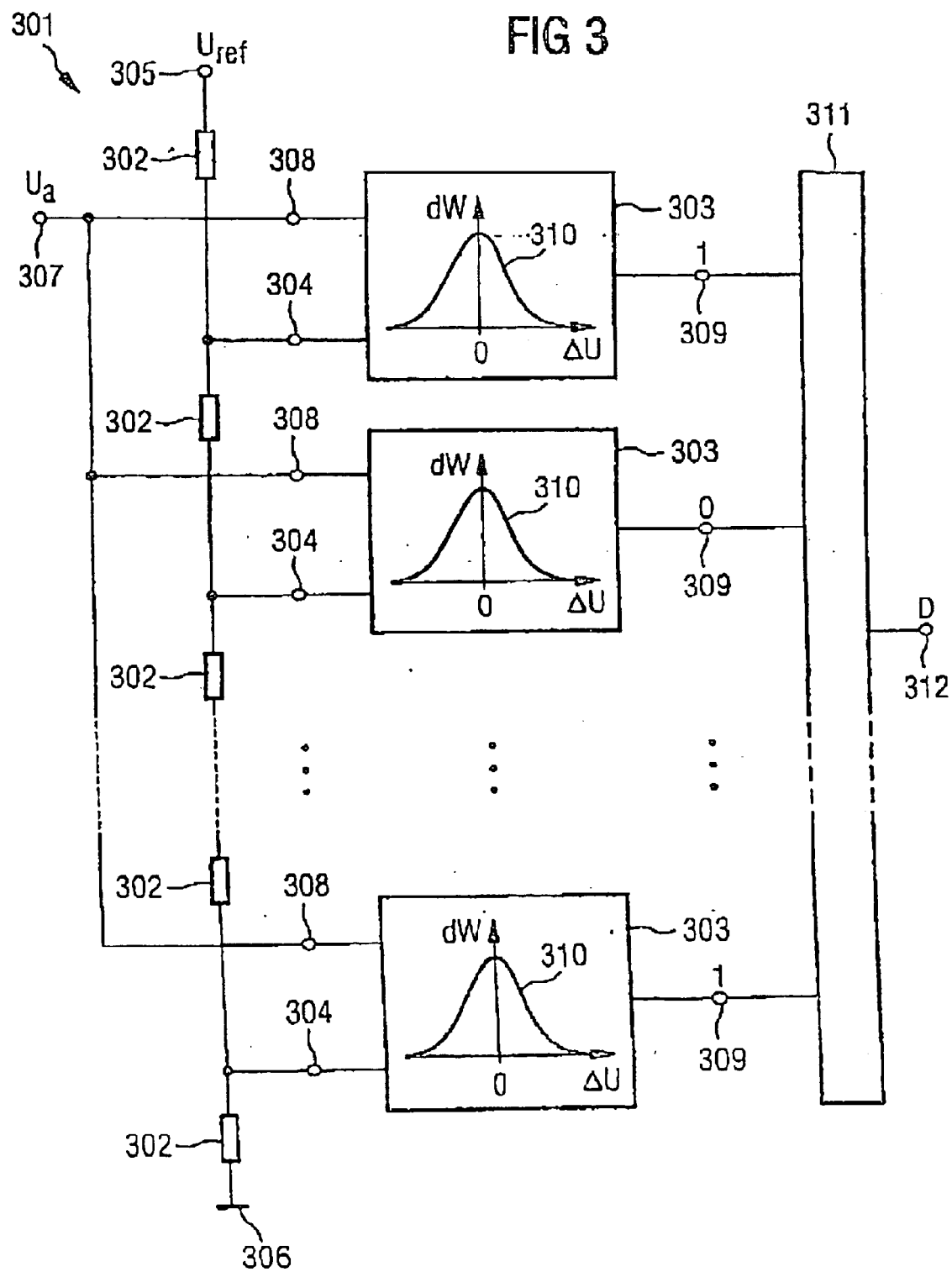
FIG. 3 shows an analog/digital converter based on a first exemplary embodiment of the invention.

FIG. 3 shows an analog/digital converter 301 based on a first exemplary embodiment of the invention, which, as a reference network, has a resistor cascade containing a plurality of series-connected resistors 302 as reference elements and also a plurality of comparators 303, a first input 304 of the comparators 303 being respectively connected between two adjacent electrical resistors 302.

The analog/digital converter 301 according to the invention uses components whose small size means that they have a high signal processing speed but are therefore rather inaccurate. The small component size means that the electrical resistors 302 and the integrated components contained in the comparators 303 therefore have a small active component area A. In 0.13 µm CMOS technology, for example, this means that a single MOS transistor has an active area of approximately (0.13×0.13) µm²=0.017 µm², which can result in variations in the threshold voltage of adjacent MOS transistors of up to several 10 mV. If the speed demands mean that very simple comparators are taken as a starting point, then the comparators comprise typically six to eight transistors and have an input offset of several 10 mV on account of the small component sizes. In such technology, conversion rates of several GSa/s can be attained.

A reference voltage $U_{ref}$ is applied to the resistor cascade between cascade input 305 and ground connection 306 such that the reference voltage $U_{ref}$ drops in partial voltages between the resistors 302. In comparison with the prior art, however, this exemplary embodiment of the invention uses, for the same resolution, a number of resistors 302 and comparators 303 which is at least as large, preferably at least twice as large. This means that a partial voltage range which is formed in the prior art and has been produced by a single one of the resistors 102 is split into at least two partial voltage ranges by the resistors 302 in line with the exemplary embodiment of the invention. These partial voltage ranges are evaluated by a respective one of the comparators 303.

An analog signal to be converted, i.e. an analog voltage $U_a$, is applied to a second input 308 on all the comparators 303 in parallel via an analog signal input 307. The comparators 303 are used to compare the analog voltage $U_a$ applied to the second input 308 with the partial voltage applied to the first input 304. If the analog voltage $U_a$ applied to one of the comparators 303 is higher than the partial voltage applied, then the comparator 303 should have been activated and should output a bit signal corresponding to a first bit value of "1" at an output 309, otherwise the bit signal corresponds to a second bit value of "0".

For the same resolution, the accuracy of the comparators 303 is low on account of the small active component area A. The comparators 303 therefore have the probability W of outputting an incorrect bit value, i.e. the output bit value does not correspond to the actual values of the applied partial voltage and of the applied analog voltage $U_a$. The probability density dW is plotted, for each of the comparators 303 in the graphs 310 in the comparators 303, against the voltage difference $\Delta U$ between the applied partial voltage and the applied analog voltage $U_a$. The input offset voltage for the comparators can be up to several 10 mV when using "minimal components", i.e. components with minimal technology-specific dimensions.

A digital evaluation unit 311 is used for reading out the bit values produced by the comparators 303, for producing a digital output signal D following the performance of statistical processing of the bit values, and for outputting the digital output signal D at a digital signal output 312. To make illustration clearer, FIG. 3 shows just three comparators 303, but the analog/digital converter 301 based on the first exemplary embodiment of the invention can have any number of comparators 303.

During statistical processing of the bit values, the digital evaluation unit 311 performs, in particular, averaging over a plurality of bit values. What are averaged in this context are the bit values from comparators 303, whose partial voltage ranges taken together represent a partial voltage range formed in the prior art. This averaging achieves error correction, i.e. the production of an incorrect digital value D by erroneous bit values is minimized.

On account of the great spread of the component parameters, the outputs of the comparators 303 do not deliver an ideal thermometer code, but rather an output signal with numerous "bubbles". However, the processing of these digital data by means of the evaluation unit 304 according to the invention means that they do not disturb the way in which the overall system works, but rather are averaged as described.

Figure 4:
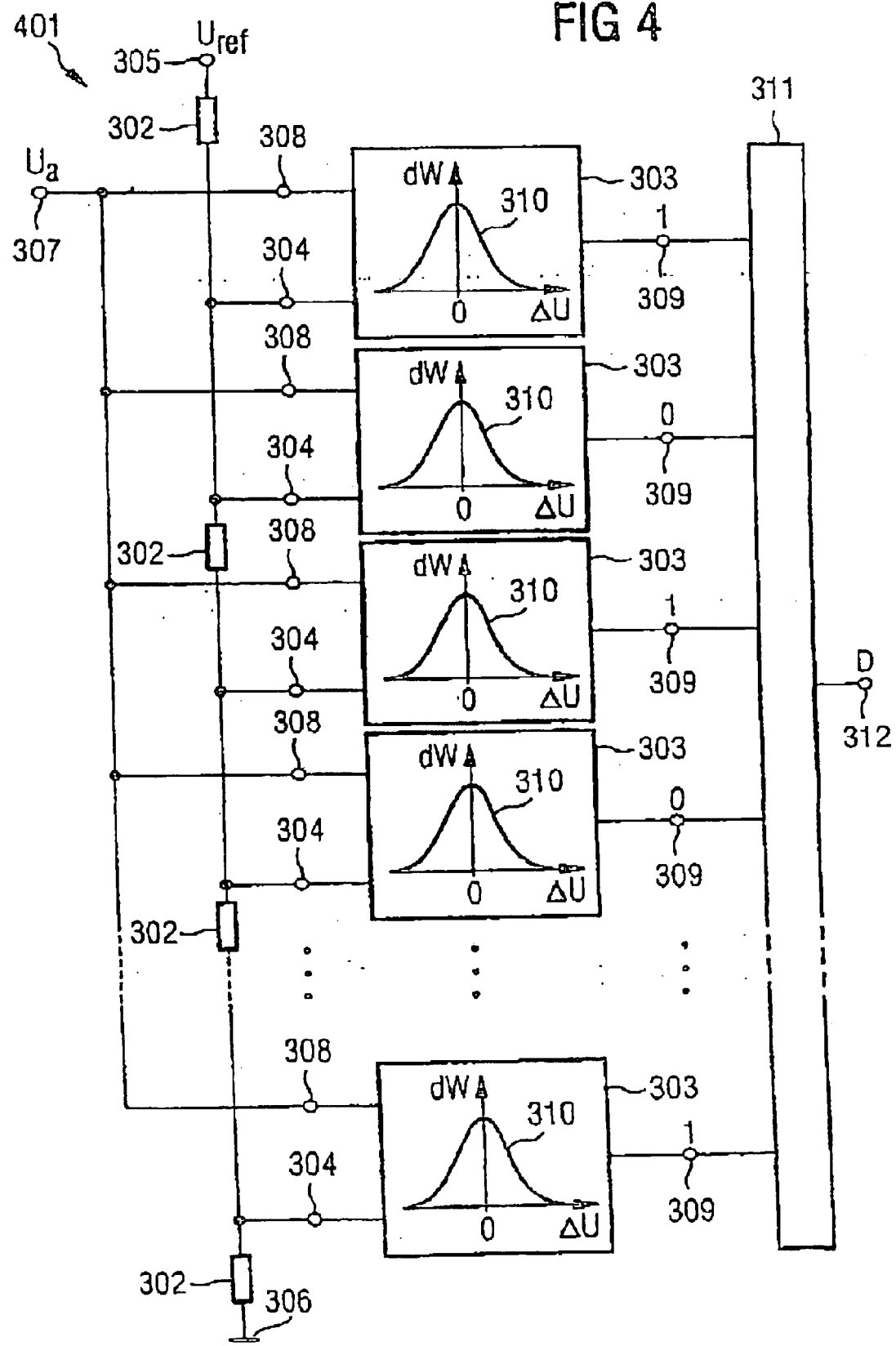
FIG. 4 shows an analog/digital converter based on a second exemplary embodiment of the invention.

FIG. 4 shows en analog/digital converter 401 based on a second exemplary embodiment of the invention, which has, as reference network, a resistor cascade containing a plurality of series-connected resistors 302 as reference elements and also a plurality of comparators 303, a first input 304 of the comparators 303 being coupled to the electrical resistors 302.

The analog/digital converter 401 based on the second exemplary embodiment of the invention uses, like the analog/digital converter 301 from FIG. 3, comparators 303 whose small active component area A means that they have a high signal processing speed and are therefore rather inaccurate.

A reference voltage $U_{ref}$ is applied to the resistor cascade between cascade input 305 and ground connection 306 such that the reference voltage $U_{ref}$ drops in partial voltages between the resistors 302. In this exemplary embodiment of the invention, these partial voltages are each evaluated in parallel by a plurality of comparators 303. In comparison with the prior art, the second exemplary embodiment of the invention thus uses, for the same resolution, a number of comparators 303 which is at least twice as large.

In FIG. 4 too, an analog signal to be converted, i.e. an analog voltage $U_a$, is applied in parallel to a second input 308 of all the comparators 303 via an analog signal input 307. The comparators 303 are in turn used to compare the analog voltage $U_a$ applied to the second input 308 with the respective partial voltage applied to the first input 304. Taking into account their inaccuracy, the comparators 303 output a bit signal on the basis of the applied analog voltage $U_a$ and the applied partial voltage.

The probability density dW that the comparators 303 change the logic state of their output at a particular input voltage $\Delta U$ is plotted against the voltage difference $\Delta U$ between the partial voltage applied and the analog voltage $U_a$ applied for each of the comparators 303 in the graphs 310 in the comparators 303.

The digital evaluation unit 311 is used for reading out the bit values produced by the comparators 303, for producing a digital output signal D following performance of statistical processing of the bit values, and for outputting the digital output signal D at a digital signal output 312. To make the illustration clearer, FIG. 4 shows just five comparators 303, with two respective comparators 303 tapping off the same partial voltage on the corresponding resistor 302, but the analog/digital converter 301 based on the second exemplary embodiment of the invention can have any number of comparators 303.

An identifying feature of the second exemplary embodiment of the invention is that the first input 304 of two respective comparators 303 are connected between two adjacent resistors 302 and thus have the same electrical potential.

In this case too, during statistical processing of the bit values, the digital evaluation unit 311 performs averaging over a plurality of bit values, in particular. What are averaged in this context are the bit values from comparators 303 which tap off the same partial voltage range. This averaging again achieves an error correction, i.e. the production of an incorrect digital value D by erroneous bit values is minimized.

Figure 1:
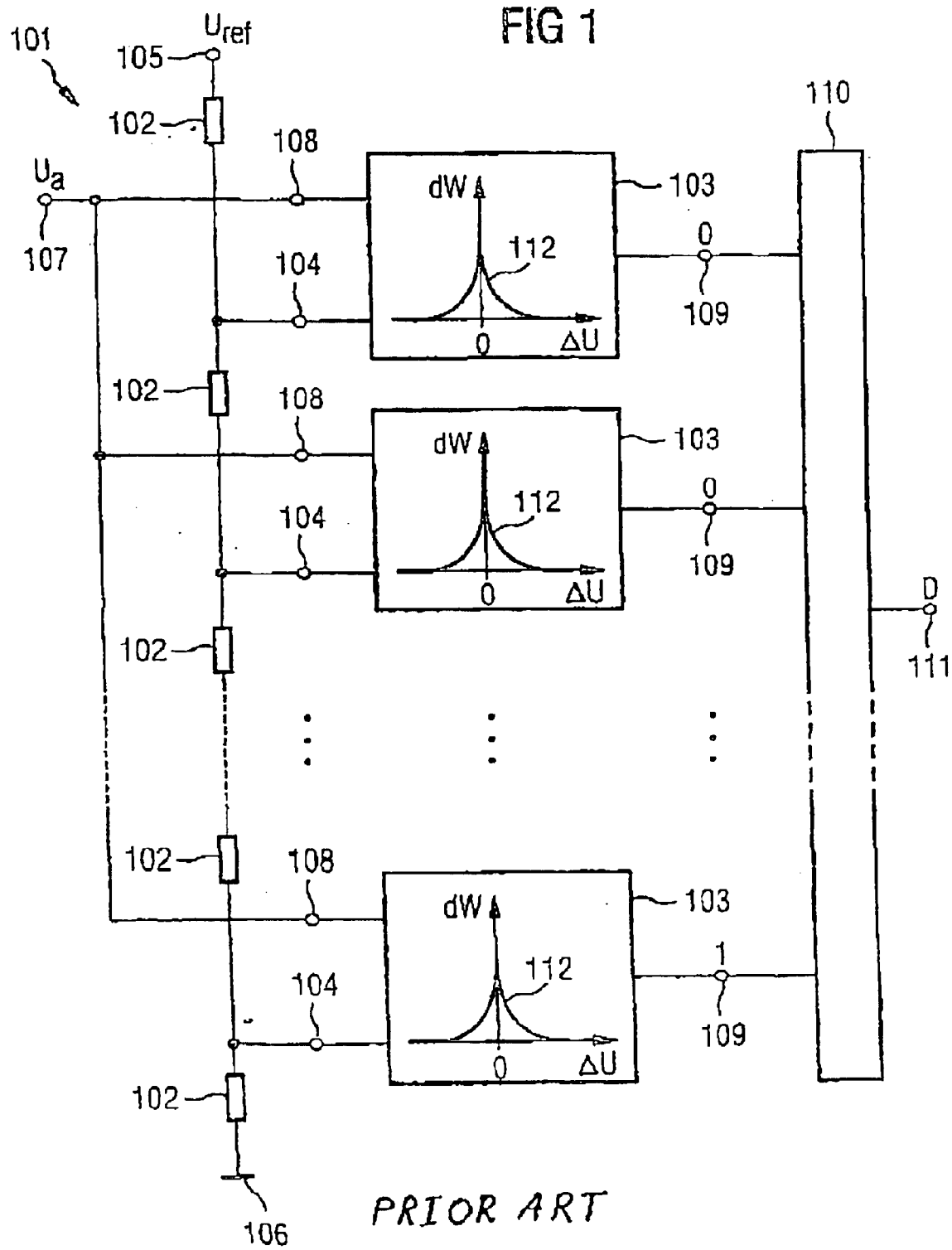
FIG. 1 shows an analog/digital converter based on the prior art.
Figure 2:
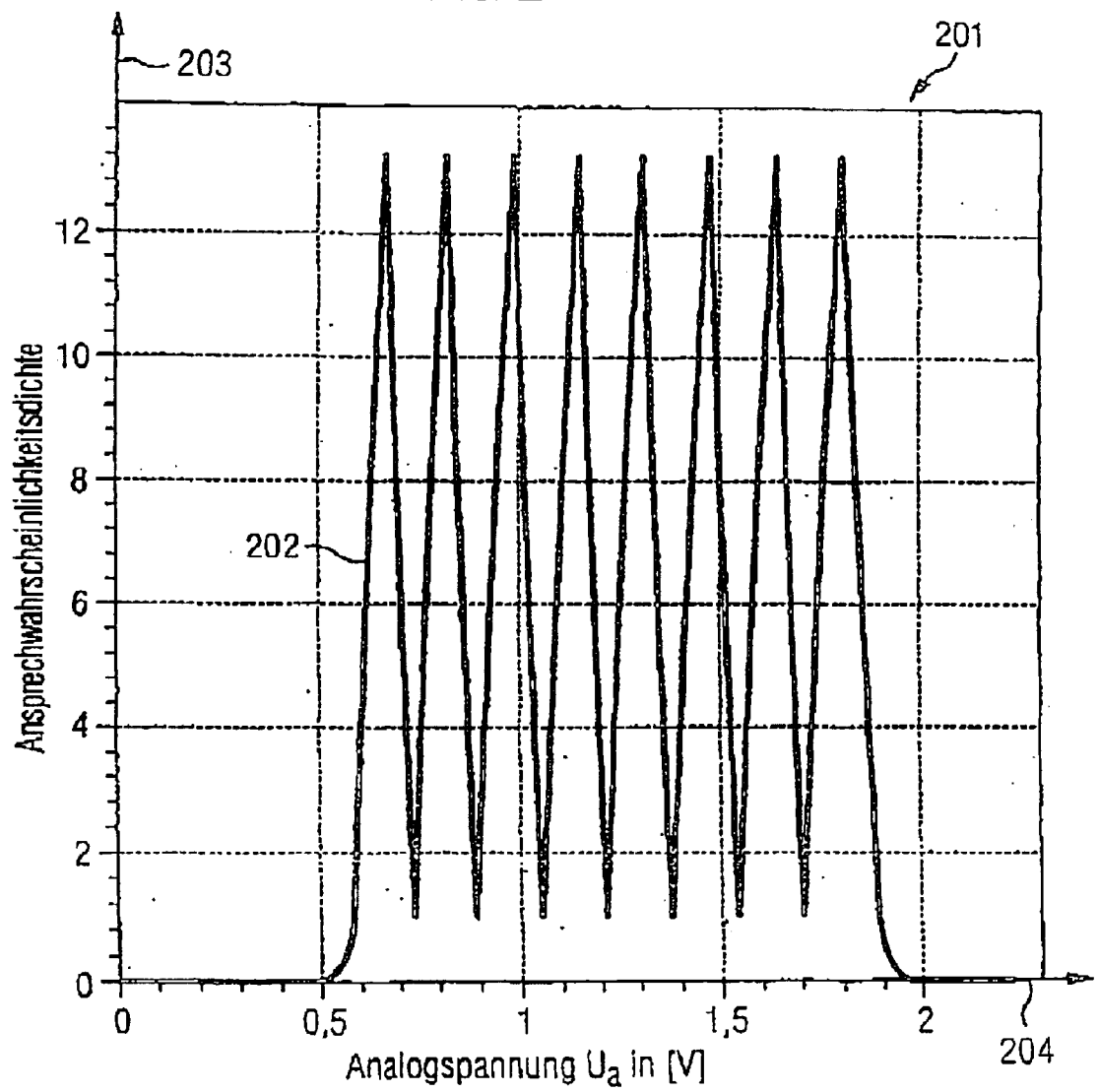
FIG. 2 shows a graph of the relative response probability for comparators in the analog/digital converter from FIG. 1.

FIG. 5 shows a graph 501 plotting a curve 502 for the response probability density 503 for comparators 303 in the analog/digital converters 301, 401 described in the two exemplary embodiments of the invention against the applied analog voltage $U_a$ 504. The graph 501 results from a combination of the individual probability densities dW for the comparators 303, which are shown as individual graphs 310 in the comparators 303 in FIG. 3 and FIG. 4 (cf. FIG. 2).

The curve 502 for the response probability density 503 for the comparators 303 is obtained as an overlapping probability density dW for the comparators 303. It follows from the overlapping probability density dW for the comparators 303 that the comparators 303 do not necessarily output a thermometer code, on account of high randomly distributed input offset voltages, and a special processing logic unit is therefore required for the digital output signals. The decreasing probability density dW at the edge regions of the voltage interval, which would impair the linearity of the analog/digital converter at that point, can be taken into account using a digital correction function in the digital part of the analog/digital converter.

In comparison with the prior art, all the exemplary embodiments of the invention clearly involve a single large comparator, which processes signals accurately but slowly, being replaced by a plurality of small comparators, which process signals less accurately but more quickly. The statistical processing of the bit values means that the digital evaluation unit 311 ensures a high level of accuracy when converting an analog signal into a digital signal D. The averaging over a plurality of small comparators on the digital side thus corresponds to a single large comparator with a high signal processing speed.

The invention thus provides an analog/digital converter 301 or 401 which, in comparison with the known analog/digital converter 101, has a signal processing speed increased by a particular factor for the same resolution. This factor is at least 1.5 to 10.

What is claimed is:

1. An analog/digital converter having a plurality of comparators and a reference network which has a plurality of reference elements wherein, at least one input of at least one comparator is connected between each reference element in the reference network; and the outputs of the comparators have a digital evaluation circuit coupled to them which can be used for statistically processing output signals produced by the comparators.

2. The analog/digital converter as claimed in claim 1, in which the reference network provided is selected from the group consisting of a resistor network, a current-source network and a capacitive network, with the reference elements used being selected from the group consisting of resistors, current sources and capacitors.

3. The analog/digital converter as claimed in claim 1 or 2, in which the digital evaluation circuit is set up such that the statistical processing can involve formation of a statistical mean.

4. The analog/digital converter as claimed in claim 1 wherein, a plurality of comparators are connected in parallel between each reference element in the reference network; and the digital evaluation circuit is set up such that the statistical processing can involve the output signals produced by parallel comparators being averaged and a common output signal being formed therefrom.

5. The analog/digital converter as claimed in claim 1 wherein, at least one comparator having an output is connected between each reference element in the reference network, the comparators being able to be activated at different input difference voltages; and the digital evaluation circuit is set up such that the statistical processing can involve the output signals produced by the comparators being averaged and a common output signal being formed therefrom.

6. The analog/digital converter as claimed in claim 1 wherein, a plurality of comparators are grouped into a plurality of groups; and the digital evaluation circuit is set up such that the statistical processing can involve the output signals produced by the comparators in a respective group being averaged and a common output signal being formed therefrom.

7. A method for converting an analog signal into a digital signal, comprising:

applying a reference signal to a reference network having a plurality of reference elements;

applying an analog signal to at least one input on a plurality of comparators;

forming a plurality of digital output signals using the comparators, which are connected to the reference network by at least one further input;

statistically processing the digital output signals; and forming a common digital signal.

8. The method as claimed in claim 7, further comprising:

grouping the digital output signals into a plurality of signal groups with a plurality of digital output signals; and statistically processing the digital output signals within the respective signal group.

9. The method as claimed in claim 7 or 8, further comprising the formation of a statistical means for the digital output signals.

* * * * *